(12) United States Patent  (10) Patent No.: US 7,671,837 B2
Forsblad et al.  (45) Date of Patent: Mar. 2, 2010

(54) SCROLLING INPUT ARRANGEMENTS USING CAPACITIVE SENSORS ON A FLEXIBLE MEMBRANE

(75) Inventors: Larry Forsblad, Cupertino, CA (US); Steve Hotelling, Cupertino, CA (US); Brian Lynch, Cupertino, CA (US); Benjamin Lyon, Cupertino, CA (US); Jan Moolsintong, Cupertino, CA (US); Doug Weber, Cupertino, CA (US); Steve Zadesky, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 879 days.

(21) Appl. No.: 11/355,022

(22) Filed: Feb. 14, 2006

(65) Prior Publication Data

US 2007/0052044 A1 Mar. 8, 2007

Related U.S. Application Data

(60) Provisional application No. 60/714,609, filed on Sep. 6, 2005.

(51) Int. Cl.
*G09G 5/00* (2006.01)
(52) U.S. Cl. ............... 345/156; 361/679.1; 361/679.18
(58) Field of Classification Search ......... 345/173–175, 345/156; 718/18.06; 361/679.1, 679, 18
See application file for complete search history.

(56) References Cited

U.S. PATENT DOCUMENTS

| 1,061,578 | A | 5/1913 | Wischhusen et al. |
| 2,798,907 | A | 7/1957 | Schneider |
| 2,903,229 | A | 9/1959 | Landge |
| 2,945,111 | A | 7/1960 | McCormick |
| 3,005,055 | A | 10/1961 | Mattke |
| 3,965,399 | A | 6/1976 | Walker et al. |

(Continued)

FOREIGN PATENT DOCUMENTS

CN 1139235 A 1/1997

(Continued)

OTHER PUBLICATIONS

SanDisk Sansa Connect User Guide; 29 pages.

(Continued)

*Primary Examiner*—Amare Mengistu
*Assistant Examiner*—Insa Sadio
(74) *Attorney, Agent, or Firm*—Morrison & Foerster LLP

(57) ABSTRACT

Scrolling input arrangements are presented including: a flexible membrane; a number of capacitive sensors mechanically integrated with the flexible membrane, the capacitive sensors radially disposed with respect to a first axis that is perpendicular with respect to the flexible membrane; an integrated circuit mechanically coupled with the flexible membrane and electronically coupled with the capacitive sensors, the integrated circuit configured to process a number of electronic signals from the capacitive sensors to provide a scrolling function; and a connection region on the flexible membrane for electronically coupling the scrolling input arrangement with an electronic device. In some embodiments, the capacitive sensors are configured with a plate element having a first surface area and a trace element having a second surface area such that the first surface area and second surface area comprise a sensor surface area, wherein the sensor surface areas for the capacitive sensors is substantially equal in size.

22 Claims, 6 Drawing Sheets

U.S. PATENT DOCUMENTS

| | | | |
|---|---|---|---|
| 4,103,252 A | 7/1978 | Bobick | |
| 4,110,749 A | 8/1978 | Janko et al. | |
| 4,115,670 A | 9/1978 | Chandler | |
| 4,121,204 A | 10/1978 | Welch et al. | |
| 4,129,747 A | 12/1978 | Pepper | |
| 4,158,216 A | 6/1979 | Bigelow | |
| 4,242,676 A | 12/1980 | Piguet et al. | |
| 4,246,452 A | 1/1981 | Chandler | |
| 4,264,903 A | 4/1981 | Bigelow | |
| 4,293,734 A | 10/1981 | Pepper, Jr. | |
| D264,969 S | 6/1982 | McGoutry | |
| 4,380,007 A | 4/1983 | Steinegger | |
| 4,380,040 A | 4/1983 | Posset | |
| 4,475,008 A | 10/1984 | Doi et al. | |
| 4,570,149 A | 2/1986 | Thornburg et al. | |
| 4,587,378 A | 5/1986 | Moore | |
| 4,644,100 A | 2/1987 | Brenner et al. | |
| 4,719,524 A | 1/1988 | Morishima et al. | |
| 4,734,034 A | 3/1988 | Maness et al. | |
| 4,736,191 A | 4/1988 | Matzke et al. | |
| 4,739,191 A | 4/1988 | Puar | |
| 4,739,299 A | 4/1988 | Eventoff et al. | |
| 4,752,655 A | 6/1988 | Tajiri et al. | |
| 4,755,765 A | 7/1988 | Ferland | |
| 4,764,717 A | 8/1988 | Tucker et al. | |
| 4,798,919 A | 1/1989 | Miessler et al. | |
| 4,810,992 A | 3/1989 | Eventoff | |
| 4,831,359 A | 5/1989 | Newell | |
| 4,849,852 A | 7/1989 | Mullins | |
| 4,856,993 A | 8/1989 | Maness et al. | |
| 4,866,602 A | 9/1989 | Hall | |
| 4,876,524 A | 10/1989 | Jenkins | |
| 4,897,511 A | 1/1990 | Itaya et al. | |
| 4,914,624 A | 4/1990 | Dunthorn | |
| 4,917,516 A | 4/1990 | Retter | |
| 4,943,889 A * | 7/1990 | Ohmatoi | 361/284 |
| 4,951,036 A | 8/1990 | Grueter et al. | |
| 4,976,435 A | 12/1990 | Shatford et al. | |
| 4,990,900 A | 2/1991 | Kikuchi | |
| 5,008,497 A | 4/1991 | Asher | |
| 5,036,321 A | 7/1991 | Leach et al. | |
| 5,053,757 A | 10/1991 | Meadows | |
| 5,125,077 A | 6/1992 | Hall | |
| 5,159,159 A | 10/1992 | Asher | |
| 5,179,648 A | 1/1993 | Hauck | |
| 5,186,646 A | 2/1993 | Pederson | |
| 5,192,082 A | 3/1993 | Inoue et al. | |
| 5,231,326 A | 7/1993 | Echols | |
| 5,237,311 A | 8/1993 | Mailey et al. | |
| 5,278,362 A | 1/1994 | Ohashi | |
| 5,305,017 A | 4/1994 | Gerpheide | |
| 5,313,027 A | 5/1994 | Inoue et al. | |
| D349,280 S | 8/1994 | Kaneko | |
| 5,339,213 A | 8/1994 | O'Callaghan | |
| 5,367,199 A | 11/1994 | Lefkowitz et al. | |
| 5,374,787 A | 12/1994 | Miller et al. | |
| 5,379,057 A | 1/1995 | Clough et al. | |
| 5,404,152 A | 4/1995 | Nagai | |
| 5,408,621 A | 4/1995 | Ben-Arie | |
| 5,414,445 A | 5/1995 | Kaneko et al. | |
| 5,416,498 A | 5/1995 | Grant | |
| 5,424,756 A | 6/1995 | Ho et al. | |
| 5,432,531 A | 7/1995 | Calder et al. | |
| 5,438,331 A | 8/1995 | Gilligan et al. | |
| D362,431 S | 9/1995 | Kaneko et al. | |
| 5,450,075 A | 9/1995 | Waddington | |
| 5,453,761 A | 9/1995 | Tanaka | |
| 5,473,343 A | 12/1995 | Kimmich et al. | |
| 5,473,344 A | 12/1995 | Bacon et al. | |
| 5,479,192 A | 12/1995 | Carroll, Jr. et al. | |
| 5,495,566 A | 2/1996 | Kwatinetz | |
| 5,508,703 A | 4/1996 | Okamura et al. | |
| 5,543,588 A | 8/1996 | Bisset et al. | |
| 5,555,004 A | 9/1996 | Ono et al. | |
| 5,559,301 A | 9/1996 | Bryan, Jr. et al. | |
| 5,559,943 A | 9/1996 | Cyr et al. | |
| 5,561,445 A | 10/1996 | Miwa et al. | |
| 5,564,112 A | 10/1996 | Hayes et al. | |
| 5,565,887 A | 10/1996 | McCambridge et al. | |
| 5,578,817 A | 11/1996 | Bidiville et al. | |
| 5,581,670 A | 12/1996 | Bier et al. | |
| 5,585,823 A | 12/1996 | Duchon et al. | |
| 5,589,893 A | 12/1996 | Gaughan et al. | |
| 5,596,347 A | 1/1997 | Robertson et al. | |
| 5,598,183 A | 1/1997 | Robertson et al. | |
| 5,611,040 A | 3/1997 | Brewer et al. | |
| 5,611,060 A | 3/1997 | Belfiore et al. | |
| 5,613,137 A | 3/1997 | Bertram et al. | |
| 5,617,114 A | 4/1997 | Bier et al. | |
| 5,627,531 A | 5/1997 | Posso et al. | |
| 5,632,679 A | 5/1997 | Tremmel | |
| 5,640,258 A | 6/1997 | Kurashima et al. | |
| D382,550 S | 8/1997 | Kaneko et al. | |
| 5,657,012 A | 8/1997 | Tart | |
| 5,661,632 A | 8/1997 | Register | |
| D385,542 S | 10/1997 | Kaneko et al. | |
| 5,675,362 A | 10/1997 | Clough et al. | |
| 5,689,285 A | 11/1997 | Asher | |
| 5,726,687 A | 3/1998 | Belfiore et al. | |
| 5,729,219 A | 3/1998 | Armstrong et al. | |
| 5,730,165 A | 3/1998 | Philipp | |
| 5,748,185 A | 5/1998 | Stephan et al. | |
| 5,751,274 A | 5/1998 | Davis | |
| 5,754,890 A | 5/1998 | Holmdahl et al. | |
| 5,777,605 A | 7/1998 | Yoshinobu et al. | |
| 5,786,818 A | 7/1998 | Brewer et al. | |
| 5,790,769 A | 8/1998 | Buxton et al. | |
| 5,805,144 A | 9/1998 | Scholder et al. | |
| 5,808,602 A | 9/1998 | Sellers | |
| 5,812,498 A | 9/1998 | Terés | |
| 5,825,351 A | 10/1998 | Tam | |
| 5,825,353 A | 10/1998 | Will | |
| 5,828,364 A | 10/1998 | Siddiqui | |
| 5,838,304 A | 11/1998 | Hall | |
| 5,841,423 A | 11/1998 | Carroll, Jr. et al. | |
| D402,281 S | 12/1998 | Ledbetter et al. | |
| 5,850,213 A | 12/1998 | Imai et al. | |
| 5,856,822 A | 1/1999 | Du et al. | |
| 5,859,629 A | 1/1999 | Tognazzini | |
| 5,869,791 A | 2/1999 | Young | |
| 5,875,311 A * | 2/1999 | Bertram et al. | 710/305 |
| 5,883,619 A | 3/1999 | Ho et al. | |
| 5,889,236 A | 3/1999 | Gillespie et al. | |
| 5,889,511 A | 3/1999 | Ong et al. | |
| 5,894,117 A | 4/1999 | Kamishima | |
| 5,903,229 A | 5/1999 | Kishi | |
| 5,907,152 A | 5/1999 | Dandiliker et al. | |
| 5,907,318 A | 5/1999 | Medina | |
| 5,909,211 A | 6/1999 | Combs et al. | |
| 5,914,706 A | 6/1999 | Kono | |
| 5,923,388 A | 7/1999 | Kurashima et al. | |
| D412,940 S | 8/1999 | Kato et al. | |
| 5,943,044 A | 8/1999 | Martinelli et al. | |
| 5,956,019 A | 9/1999 | Bang et al. | |
| 5,959,611 A | 9/1999 | Smailagic et al. | |
| 5,964,661 A | 10/1999 | Dodge | |
| 5,973,668 A | 10/1999 | Watanabe | |
| 6,000,000 A | 12/1999 | Hawkins et al. | |
| 6,002,389 A | 12/1999 | Kasser et al. | |
| 6,005,299 A | 12/1999 | Hengst | |
| 6,025,832 A | 2/2000 | Sudo et al. | |
| 6,031,518 A | 2/2000 | Adams et al. | |
| 6,034,672 A | 3/2000 | Gaultiet et al. | |
| 6,057,829 A | 5/2000 | Silfvast | |

| Patent | Date | Inventor |
|---|---|---|
| 6,075,533 A | 6/2000 | Chang |
| 6,084,574 A | 7/2000 | Bidiville |
| D430,169 S | 8/2000 | Scibora |
| 6,097,372 A | 8/2000 | Suzuki |
| 6,122,526 A | 9/2000 | Parulski et al. |
| 6,124,587 A | 9/2000 | Bidiville et al. |
| 6,128,006 A | 10/2000 | Rosenberg et al. |
| 6,131,048 A | 10/2000 | Sudo et al. |
| 6,163,312 A | 12/2000 | Furuya |
| 6,166,721 A | 12/2000 | Kuroiwa et al. |
| 6,179,496 B1 | 1/2001 | Chou |
| 6,181,322 B1 | 1/2001 | Nanavati |
| D437,860 S | 2/2001 | Suzuki et al. |
| 6,188,393 B1 | 2/2001 | Shu |
| 6,191,774 B1 | 2/2001 | Schena et al. |
| 6,198,054 B1 | 3/2001 | Janniere |
| 6,198,473 B1 | 3/2001 | Armstrong |
| 6,211,861 B1 | 4/2001 | Rosenberg et al. |
| 6,219,038 B1 | 4/2001 | Cho |
| D442,592 S | 5/2001 | Ledbetter et al. |
| 6,225,976 B1 | 5/2001 | Yates et al. |
| 6,225,980 B1 | 5/2001 | Weiss et al. |
| 6,226,534 B1 | 5/2001 | Aizawa |
| 6,227,966 B1 | 5/2001 | Yokoi |
| D443,616 S | 6/2001 | Fisher et al. |
| 6,243,078 B1 | 6/2001 | Rosenberg |
| 6,243,080 B1 | 6/2001 | Molne |
| 6,248,017 B1 | 6/2001 | Roach |
| 6,254,477 B1 | 7/2001 | Sasaki et al. |
| 6,256,011 B1 | 7/2001 | Culver |
| 6,262,717 B1 | 7/2001 | Donohue et al. |
| 6,262,785 B1 | 7/2001 | Kim |
| 6,266,050 B1 | 7/2001 | Oh et al. |
| D448,810 S | 10/2001 | Goto |
| 6,297,795 B1 | 10/2001 | Kato et al. |
| 6,297,811 B1 | 10/2001 | Kent et al. |
| D450,713 S | 11/2001 | Masamitsu et al. |
| 6,314,483 B1 | 11/2001 | Goto et al. |
| 6,323,845 B1 | 11/2001 | Robbins |
| D452,250 S | 12/2001 | Chan |
| 6,340,800 B1 | 1/2002 | Zhai et al. |
| D454,568 S | 3/2002 | Andre et al. |
| 6,357,887 B1 | 3/2002 | Novak |
| D455,793 S | 4/2002 | Lin |
| 6,373,265 B1 | 4/2002 | Morimoto et al. |
| 6,373,470 B1 | 4/2002 | Andre et al. |
| 6,377,530 B1 | 4/2002 | Burrows |
| 6,396,523 B1 | 5/2002 | Segal et al. |
| 6,424,338 B1 | 7/2002 | Anderson |
| 6,429,846 B2 | 8/2002 | Rosenberg et al. |
| 6,429,852 B1 | 8/2002 | Adams et al. |
| 6,473,069 B1 | 10/2002 | Gerphelde |
| 6,492,979 B1 | 12/2002 | Kent et al. |
| 6,496,181 B1 | 12/2002 | Bomer et al. |
| 6,497,412 B1 | 12/2002 | Bramm |
| D468,365 S | 1/2003 | Bransky et al. |
| D469,109 S | 1/2003 | Andre et al. |
| D472,245 S | 3/2003 | Andre et al. |
| 6,546,231 B1 | 4/2003 | Someya et al. |
| 6,587,091 B2 | 7/2003 | Serpa |
| 6,606,244 B1 | 8/2003 | Liu et al. |
| 6,636,197 B1 | 10/2003 | Goldenberg et al. |
| 6,639,584 B1 | 10/2003 | Li |
| 6,640,250 B1 | 10/2003 | Chang et al. |
| 6,650,975 B2 | 11/2003 | Ruffner |
| D483,809 S | 12/2003 | Lim |
| 6,664,951 B1 | 12/2003 | Fujii et al. |
| 6,677,927 B1 | 1/2004 | Bruck et al. |
| 6,686,904 B1 | 2/2004 | Sherman et al. |
| 6,703,550 B2 | 3/2004 | Chu |
| 6,724,817 B1 | 4/2004 | Simpson et al. |
| 6,727,889 B2 | 4/2004 | Shaw |
| D489,731 S | 5/2004 | Huang |
| 6,738,045 B2 | 5/2004 | Hinckley et al. |
| 6,750,803 B2 | 6/2004 | Yates et al. |
| 6,781,576 B2 | 8/2004 | Tamura |
| 6,788,288 B2 | 9/2004 | Ano |
| 6,791,533 B2 | 9/2004 | Su |
| 6,795,057 B2 | 9/2004 | Gordon |
| D497,618 S | 10/2004 | Andre et al. |
| 6,844,872 B1 | 1/2005 | Farag et al. |
| 6,865,718 B2 | 3/2005 | Levi Montalcini |
| 6,886,842 B2 | 5/2005 | Vey et al. |
| 6,894,916 B2 | 5/2005 | Reohr et al. |
| D506,476 S | 6/2005 | Andre et al. |
| 6,922,189 B2 | 7/2005 | Fujiyoshi |
| 6,930,494 B2 | 8/2005 | Tesdahl et al. |
| 6,977,808 B2 | 12/2005 | Lam et al. |
| 6,978,127 B1 | 12/2005 | Bulthuis et al. |
| 7,006,077 B1 | 2/2006 | Uusimäki |
| 7,046,230 B2 | 5/2006 | Zadeski et al. |
| 7,069,044 B2 | 6/2006 | Okada et al. |
| 7,084,856 B2 | 8/2006 | Huppi |
| 7,113,196 B2 | 9/2006 | Kerr |
| 7,113,520 B1 | 9/2006 | Meenan |
| 7,119,792 B1 | 10/2006 | Andre et al. |
| 7,215,319 B2 | 5/2007 | Kamijo et al. |
| 7,233,318 B1 | 6/2007 | Farag et al. |
| 7,236,154 B1 | 6/2007 | Kerr et al. |
| 7,253,643 B1 | 8/2007 | Seguine |
| 7,279,647 B2 | 10/2007 | Philipp |
| 7,395,081 B2 | 7/2008 | Bonnelykke Kristensen et al. |
| 7,466,307 B2 * | 12/2008 | Trent, Jr. et al. ............ 345/173 |
| 2001/0011991 A1 | 8/2001 | Wang et al. |
| 2001/0033270 A1 | 10/2001 | Osawa et al. |
| 2001/0043545 A1 | 11/2001 | Aratani |
| 2001/0050673 A1 | 12/2001 | Davenport |
| 2001/0051046 A1 | 12/2001 | Watanabe et al. |
| 2002/0027547 A1 | 3/2002 | Kamijo |
| 2002/0030665 A1 | 3/2002 | Ano |
| 2002/0033848 A1 | 3/2002 | Sciammarella et al. |
| 2002/0045960 A1 | 4/2002 | Phillips et al. |
| 2002/0071550 A1 | 6/2002 | Pletikosa |
| 2002/0089545 A1 | 7/2002 | Montalcini |
| 2002/0118131 A1 | 8/2002 | Yates et al. |
| 2002/0118169 A1 | 8/2002 | Hinckley et al. |
| 2002/0154090 A1 | 10/2002 | Lin |
| 2002/0158844 A1 | 10/2002 | McLoone et al. |
| 2002/0164156 A1 | 11/2002 | Bilbrey |
| 2002/0180701 A1 | 12/2002 | Hayama et al. |
| 2003/0002246 A1 | 1/2003 | Kerr |
| 2003/0025679 A1 * | 2/2003 | Taylor et al. ............... 345/175 |
| 2003/0028346 A1 | 2/2003 | Sinclair et al. |
| 2003/0043121 A1 | 3/2003 | Chen |
| 2003/0043174 A1 | 3/2003 | Hinckley et al. |
| 2003/0050092 A1 | 3/2003 | Yun |
| 2003/0076301 A1 | 4/2003 | Tsuk et al. |
| 2003/0076303 A1 | 4/2003 | Huppi |
| 2003/0091377 A1 | 5/2003 | Hsu et al. |
| 2003/0095095 A1 | 5/2003 | Pihlaja |
| 2003/0095096 A1 | 5/2003 | Robbin et al. |
| 2003/0098851 A1 | 5/2003 | Brink |
| 2003/0103043 A1 | 6/2003 | Mulligan et al. |
| 2003/0184517 A1 | 10/2003 | Senzui et al. |
| 2003/0206202 A1 | 11/2003 | Moriya |
| 2004/0080682 A1 | 4/2004 | Dalton |
| 2004/0156192 A1 | 8/2004 | Kerr et al. |
| 2004/0215986 A1 | 10/2004 | Shakkarwar |
| 2004/0224638 A1 | 11/2004 | Fadell et al. |
| 2004/0239622 A1 | 12/2004 | Proctor et al. |
| 2004/0252109 A1 | 12/2004 | Trent, Jr. et al. |
| 2004/0253989 A1 | 12/2004 | Tupler et al. |
| 2004/0263388 A1 | 12/2004 | Krumm et al. |
| 2004/0267874 A1 | 12/2004 | Westberg et al. |
| 2005/0030048 A1 | 2/2005 | Bolender |
| 2005/0052425 A1 | 3/2005 | Zadeski et al. |

| Pub. No. | Date | Name |
|---|---|---|
| 2005/0052429 A1 | 3/2005 | Philipp |
| 2005/0083299 A1* | 4/2005 | Nagasaka .................. 345/156 |
| 2005/0083307 A1 | 4/2005 | Aufderheide |
| 2005/0104867 A1* | 5/2005 | Westerman et al. ......... 345/173 |
| 2005/0110768 A1 | 5/2005 | Marriott et al. |
| 2005/0204309 A1 | 9/2005 | Szeto |
| 2006/0026521 A1 | 2/2006 | Hotelling et al. |
| 2006/0032680 A1 | 2/2006 | Elias et al. |
| 2006/0097991 A1 | 5/2006 | Hotelling et al. |
| 2006/0181517 A1 | 8/2006 | Zadesky et al. |
| 2006/0197750 A1 | 9/2006 | Kerr et al. |
| 2006/0232557 A1 | 10/2006 | Fallot-Burghardt |
| 2006/0250377 A1 | 11/2006 | Zadesky et al. |
| 2006/0274905 A1 | 12/2006 | Lindahl et al. |
| 2006/0284836 A1 | 12/2006 | Philipp |
| 2007/0013671 A1 | 1/2007 | Zadesky et al. |
| 2007/0052691 A1 | 3/2007 | Zadesky et al. |
| 2007/0080936 A1 | 4/2007 | Tsuk et al. |
| 2007/0080938 A1 | 4/2007 | Robbin et al. |
| 2007/0083822 A1 | 4/2007 | Robbin et al. |
| 2007/0085841 A1 | 4/2007 | Tsuk et al. |
| 2007/0152975 A1 | 7/2007 | Ogihara |
| 2007/0152977 A1 | 7/2007 | Ng et al. |
| 2007/0152983 A1 | 7/2007 | McKillop et al. |
| 2007/0242057 A1 | 10/2007 | Zadesky et al. |
| 2007/0247421 A1 | 10/2007 | Orsley et al. |
| 2007/0273671 A1 | 11/2007 | Zadesky et al. |
| 2007/0276525 A1 | 11/2007 | Zadesky et al. |
| 2007/0279394 A1 | 12/2007 | Lampell |
| 2007/0290990 A1 | 12/2007 | Robbin et al. |
| 2007/0296709 A1 | 12/2007 | GuangHai |
| 2008/0006453 A1 | 1/2008 | Hotelling |
| 2008/0006454 A1 | 1/2008 | Hotelling |
| 2008/0007533 A1 | 1/2008 | Hotelling |
| 2008/0007539 A1 | 1/2008 | Hotelling |
| 2008/0012837 A1 | 1/2008 | Marriott et al. |
| 2008/0018615 A1 | 1/2008 | Zadesky et al. |
| 2008/0018616 A1 | 1/2008 | Lampell et al. |
| 2008/0018617 A1 | 1/2008 | Ng et al. |
| 2008/0036734 A1 | 2/2008 | Forsblad et al. |
| 2008/0087476 A1 | 4/2008 | Prest |
| 2008/0088582 A1 | 4/2008 | Prest |
| 2008/0088596 A1 | 4/2008 | Prest |
| 2008/0088597 A1 | 4/2008 | Prest |
| 2008/0088600 A1 | 4/2008 | Prest |
| 2008/0094352 A1 | 4/2008 | Tsuk et al. |
| 2008/0098330 A1 | 4/2008 | Tsuk et al. |
| 2008/0111795 A1 | 5/2008 | Bollinger |
| 2008/0284742 A1 | 11/2008 | Prest et al. |
| 2009/0179854 A1 | 1/2009 | Weber et al. |
| 2009/0058687 A1 | 3/2009 | Rothkopf et al. |
| 2009/0058801 A1 | 3/2009 | Bull |
| 2009/0073130 A1 | 3/2009 | Weber et al. |
| 2009/0141046 A1 | 6/2009 | Rathnam et al. |

FOREIGN PATENT DOCUMENTS

| | | |
|---|---|---|
| CN | 1455615 | 11/2003 |
| CN | 1499356 | 5/2004 |
| DE | 3615742 | 11/1987 |
| DE | 19722636 | 12/1998 |
| DE | 10022537 | 11/2000 |
| DE | 20019074 U1 | 2/2001 |
| EP | 0178157 | 4/1986 |
| EP | 0419145 A1 | 3/1991 |
| EP | 0498540 | 8/1992 |
| EP | 0521683 A2 | 1/1993 |
| EP | 0674288 A1 | 9/1995 |
| EP | 0 731 407 A1 | 9/1996 |
| EP | 0 551 778 B1 | 1/1997 |
| EP | 0551778 B1 | 1/1997 |
| EP | 0880091 | 11/1998 |
| EP | 1 026 713 | 8/2000 |
| EP | 1081922 A2 | 3/2001 |
| EP | 1098241 A2 | 5/2001 |
| EP | 1 133 057 | 9/2001 |
| EP | 1162826 A2 | 12/2001 |
| EP | 1 168 396 | 1/2002 |
| EP | 1205836 A2 | 5/2002 |
| EP | 1 244 053 | 9/2002 |
| EP | 1251455 A2 | 10/2002 |
| EP | 1 467 392 | 10/2004 |
| EP | 1482401 A2 | 12/2004 |
| EP | 1 496 467 | 1/2005 |
| EP | 1542437 A2 | 6/2005 |
| EP | 1 589 407 | 10/2005 |
| FR | 2 686 440 A1 | 7/1993 |
| GB | 2015167 | 9/1979 |
| GB | 2072389 | 9/1981 |
| GB | 2315186 | 1/1998 |
| GB | 2333215 | 7/1999 |
| GB | 2391060 | 1/2004 |
| GB | 2402105 A | 12/2004 |
| JP | 57-95722 | 6/1982 |
| JP | 57-097626 | 6/1982 |
| JP | 61-117619 | 6/1986 |
| JP | 61-124009 | 6/1986 |
| JP | 61-164547 | 1/1988 |
| JP | 63-106826 | 5/1988 |
| JP | 63-181022 | 7/1988 |
| JP | 63-298518 | 12/1988 |
| JP | 03-57617 | 6/1991 |
| JP | 3-192418 | 8/1991 |
| JP | 04-32920 | 2/1992 |
| JP | 5-041135 | 2/1993 |
| JP | 5-080938 | 4/1993 |
| JP | 5-101741 | 4/1993 |
| JP | 05-36623 | 5/1993 |
| JP | 5-189110 | 7/1993 |
| JP | 5-205565 | 8/1993 |
| JP | 5-211021 | 8/1993 |
| JP | 5-217464 | 8/1993 |
| JP | 05-233141 | 9/1993 |
| JP | 05-262276 | 10/1993 |
| JP | 5-265656 | 10/1993 |
| JP | 5-274956 | 10/1993 |
| JP | 05-289811 | 11/1993 |
| JP | 5-298955 | 11/1993 |
| JP | 5-325723 | 12/1993 |
| JP | 06-20570 | 1/1994 |
| JP | 6-084428 | 3/1994 |
| JP | 6-089636 | 3/1994 |
| JP | 06-096639 | 4/1994 |
| JP | 6-96639 | 4/1994 |
| JP | 06-111685 | 4/1994 |
| JP | 06-111695 | 4/1994 |
| JP | 6-111695 | 4/1994 |
| JP | 6-139879 | 5/1994 |
| JP | 06-187078 | 7/1994 |
| JP | 06-208433 | 7/1994 |
| JP | 6-267382 | 9/1994 |
| JP | 06-283993 | 10/1994 |
| JP | 6-333459 | 12/1994 |
| JP | 07-107574 | 4/1995 |
| JP | 7-107574 | 4/1995 |
| JP | 07-41882 | 7/1995 |
| JP | 7-41882 | 7/1995 |
| JP | 7-201249 | 8/1995 |
| JP | 07-201256 | 8/1995 |
| JP | 07-253838 | 10/1995 |
| JP | 07-261899 | 10/1995 |
| JP | 7-261899 | 10/1995 |
| JP | 7-261922 | 10/1995 |
| JP | 07-296670 | 11/1995 |
| JP | 7-319001 | 12/1995 |
| JP | 08-016292 | 1/1996 |

| | | |
|---|---|---|
| JP | 8-115158 | 5/1996 |
| JP | 08-115158 | 5/1996 |
| JP | 8-203387 | 8/1996 |
| JP | 8-293226 | 11/1996 |
| JP | 8-298045 | 11/1996 |
| JP | 08-299541 | 11/1996 |
| JP | 8-316664 | 11/1996 |
| JP | 09-044289 | 2/1997 |
| JP | 09-069023 | 3/1997 |
| JP | 09-128148 | 5/1997 |
| JP | 9-134248 | 5/1997 |
| JP | 9-218747 | 8/1997 |
| JP | 09-230993 | 9/1997 |
| JP | 9-230993 | 9/1997 |
| JP | 9-231858 | 9/1997 |
| JP | 09-233161 | 9/1997 |
| JP | 9-251347 | 9/1997 |
| JP | 9-258895 | 10/1997 |
| JP | 9-288926 | 11/1997 |
| JP | 9-512979 | 12/1997 |
| JP | 10-74127 | 3/1998 |
| JP | 10-074429 | 3/1998 |
| JP | 10-198507 | 7/1998 |
| JP | 10-227878 | 8/1998 |
| JP | 10-240693 | 9/1998 |
| JP | 10-320322 | 12/1998 |
| JP | 10-326149 | 12/1998 |
| JP | 11-24834 | 1/1999 |
| JP | 11-184607 | 7/1999 |
| JP | 11-203045 | 7/1999 |
| JP | A 10-012010 | 7/1999 |
| JP | A 10-012025 | 7/1999 |
| JP | A 10-012026 | 7/1999 |
| JP | A 10-012027 | 7/1999 |
| JP | A 10-012028 | 7/1999 |
| JP | A 10-012029 | 7/1999 |
| JP | 11-212725 | 8/1999 |
| JP | A 10-089535 | 10/1999 |
| JP | 2000-215549 | 8/2000 |
| JP | 2000-267786 | 9/2000 |
| JP | 2000-267797 | 9/2000 |
| JP | 2000-353045 | 12/2000 |
| JP | 2001-11769 | 1/2001 |
| JP | 2001-22508 | 1/2001 |
| JP | 2001-184158 | 7/2001 |
| JP | 3085481 | 2/2002 |
| JP | 2002-215311 | 8/2002 |
| JP | 2003-517674 | 5/2003 |
| JP | 2003-280807 | 10/2003 |
| JP | A 2005-99635 | 9/2005 |
| JP | A 2005-133824 | 10/2005 |
| JP | A 2005-134953 | 10/2005 |
| JP | A 2005-235579 | 1/2006 |
| JP | A 2005-358970 | 7/2006 |
| JP | 3852854 | 9/2006 |
| JP | 3852854 | 12/2006 |
| JP | A 2005-312433 | 5/2007 |
| KR | 1998-71394 | 10/1998 |
| KR | 1999-50198 | 7/1999 |
| KR | 2000-08579 | 2/2000 |
| KR | 2001-0052016 | 6/2001 |
| KR | 2002-65059 | 8/2002 |
| TW | 431607 | 4/2001 |
| TW | 00470193 | 12/2001 |
| TW | 547716 | 8/2003 |
| TW | 1220491 | 8/2004 |
| WO | WO-94/17494 | 8/1994 |
| WO | WO 95/00897 A1 | 1/1995 |
| WO | WO-96/27968 | 9/1996 |
| WO | WO-98/14863 | 4/1998 |
| WO | WO-99/49443 | 9/1999 |
| WO | WO-01/044912 | 6/2001 |
| WO | WO-03/044645 A1 | 5/2003 |
| WO | WO 03/044956 | 5/2003 |
| WO | WO 03/088176 | 10/2003 |
| WO | WO 03/090008 | 10/2003 |
| WO | WO 2004/040606 | 5/2004 |
| WO | WO-2005/055620 A2 | 6/2005 |
| WO | WO 2005/076117 | 8/2005 |
| WO | WO-2005/124526 A2 | 12/2005 |
| WO | WO-2006/021211 A2 | 3/2006 |
| WO | WO 2006/037545 | 4/2006 |
| WO | WO 2006/104745 | 10/2006 |
| WO | WO-2006/135127 | 12/2006 |
| WO | WO 2007/025858 | 3/2007 |
| WO | WO-2007/078477 | 7/2007 |
| WO | WO-2007/084467 | 7/2007 |
| WO | WO-2008/045414 | 4/2008 |

OTHER PUBLICATIONS

"Touchpad," Notebook PC Manual, ACER Information Co. Ltd., Feb. 16, 2005, pp. 11-12.

"Atari VCS/2600 Peripherals", www.classicgaming.com, downloaded Feb. 28, 2007, pp. 1-15.

"Alps Electric introduces the GlidePoint Wave Keyboard; combines a gently curved design with Alps' advanced GlidePoint Technology", Business Wire, (Oct. 21, 1996).

Alps Electric Ships GlidePoint Keyboard for the Macintosh; Includes a GlidePoint Touchpad, Erase-Eaze Backspace Key and Contoured Wrist Rest, Business Wire, (Jul. 1, 1996).

"APS show guide to exhibitors", Physics Today, 49(3) (Mar. 1996).

"Design News literature plus", Design News, 51(24) (Dec. 18, 1995).

"Manufactures", Laser Focus World, Buyers Guide '96, 31(12) (Dec. 1995).

"National Design Engineering Show", Design News, 52(5) (Mar. 4, 1996).

"Preview of exhibitor booths at the Philadelphia show", Air Conditioning Heating & Refrigerator News, 200(2) (Jan. 13, 1997).

"Product news", Design News, 53(11) (Jun. 9, 1997).

"Product news", Design News, 53(9) (May 5, 1997).

Ahl, David, "Controller Updated", Creative Computing 9(12) (Dec. 1983).

Baig, E.C., "Your PC Might Just Need a Mouse", U.S. News and World Report, 108(22), (Jun. 4, 1990).

Bartimo, Jim, "The Portables: Traveling Quickly", Computerworld (Nov. 14, 1983).

Brink et al., "Pumped-up portables", U.S. News & World Report, 116(21) (May 30, 1994).

Brown et al., "Windows on Tablets as a Means of Achieving Virtual Input Devices", Human-Computer Interaction—Interact '90 (1990).

Buxton et al., "Issues and Techniques in Touch-Sensitive Tablet Input", Computer Graphics, 19(3), Proceedings of SIGGRAPH '85 (1985).

Chen et al., "A Study in Interactive 3-D Rotation Using 2-D Control Devices", Computer Graphics 22(4) (Aug. 1988).

Evans et al., "Tablet-based Valuators that Provide One, Two, or Three Degrees of Freedom", Computer Graphics 15(3) (Aug. 1981).

Jesitus, John, "Broken promises?", Industry Week/IW, 246(20) (Nov. 3, 1997).

Mims, Forrest M. III, "A Few Quick Pointers; Mouses, Touch Screens, Touch Pads, Light Pads, and the Like Can Make Your System Easier to Use", Computers and Electronics, 22, (May 1984).

Nass, Richard, "Touchpad input device goes digital to give portable systems a desktop "mouse-like" feel", Electronic Design, 44(18) (Sep. 3, 1996).

Perenson, Melissa, "New & Improved: Touchpad Redux", PC Magazine (Sep. 10, 1996).

Petersen, Marty, "Koalapad Touch Tablet & Micro Illustrator Software", InfoWorld, (Oct. 10, 1983).

Petruzzellis, "Force-Sensing Resistors" Electronics Now, 64(3), (Mar. 1993).

Soderholm, Lars D., "Sensing Systems for 'Touch and Feel'", Design News, (May 8, 1989).

Sony presents "Choice Without Compromise" at IBC '97 M2 Presswire (Jul. 24, 1997.).

Spiwak, Marc, "A Great New Wireless Keyboard", Popular Electronics, 14(12) (Dec. 1997).
Spiwak, Marc, "A Pair of Unusual Controllers", Popular Electronics 14(4) (Apr. 1997).
Tessler, Franklin, "Point Pad", Macworld 12(10) (Oct. 1995).
Tessler, Franklin, "Smart Input: How to Chose from the New Generation of Innovative Input Devices," Macworld 13(5) (May 1996).
Tessler, Franklin, "Touchpads", Macworld 13(2) (Feb. 1996).
"Triax Custom Controllers Due; Video Game Controllers," HFD—The Weekly Home Furnishings Newspaper, 67(1), (Jan. 4, 1993).
Chinese Office Action issue Dec. 29, 2006, directed to CN Application No. 200510103886.3, 25 pages.
"About Quicktip®" www.logicad3d.com/docs/qt.html, downloaded Apr. 8, 2002.
"Apple Presents iPod: Ultra-Portable MP3 Music Player Puts 1,000 Songs in Your Pocket," retreived from http://www.apple.com/pr/library/2001/oct/23ipod.html on Oct. 23, 2001.
"Apple Unveils Optical Mouse and New Pro Keyboard," Press Release, Jul. 19, 2000.
"Der Klangmeister," Connect Magazine, Aug. 1998.
"Neuros MP3 Digital Audio Computer," www.neurosaudio.com, downloaded Apr. 9, 2003.
"OEM Touchpad Modules" website www.glidepoint.com/sales/modules.index.shtml, downloaded Feb. 13, 2002.
"Product Overview—ErgoCommander®," www.logicad3d.com/products/ErgoCommander.htm,downloaded Apr. 8, 2002.
"Product Overview—SpaceMouse® Classic," www.logicad3d.com/products/Classic.htm,downloaded April 8, 2002.
"System Service and Troubleshooting Manual," www.dsplib.com/intv/Master, downloaded Dec. 11, 2002.
"Synaptics Tough Pad Interfacing Guide," Second Edition, Mar. 25, 1998, Synaptics, Inc., San Jose, CA, pp. 1-90.
Bang & Olufsen Telecom a/s, "BeoCom 6000 User Guide 2000." BeoCom 6000, Sales Training Brochure, date unknown.
BeoCom 6000, Sales Training Brochure, date unknown.
Bray, "Phosphors help switch on xenon," Physics in Action, pp. 1-3, Apr. 1999.
Chapweske, Adam "PS/2 Mouse/Keyboard Protocol," 1999, http://panda.cs.ndsu.nodak.edu/~achapwes/PICmicro/PS2/ps2.htm.
De Meyer, Kevin, "Crystal Optical Mouse," Feb. 14, 2002, Heatseekerz, Web Article 19.
EVB Elektronik "TSOP6238 IR Receiver Modules for Infrared Remote Control Systems" dated Jan. 2004 1 page.
Fiore, "Zen Touchpad," Cornell University, May 2000, 6 pages.
Gadgetboy, "Point and click with the latest mice," CNET Asia Product Review, www.asia.cnet.com/reviews...are/gadgetboy/0,39001770,380235900,00.htm, downloaded Dec. 5, 2001.
Gfroerer, "Photoluminescence in Analysis of Surfaces and Interfaces," Encyclopedia of Analytical Chemistry, pp. 1-23, Copyright John Wiley & Sons Ltd, Chichester, 2000.
Letter re: Bang & Olufsen a/s by David Safran, Nixon Peabody, LLP May 21, 2004.
Luna Technologies International, Inc., LUNA Photoluminescent Safety Products, "Photoluminescence—What is Photoluminescence?" from website at http://www.lunaplast.com/photoluminescence.com on Dec. 27, 2005.
Photographs of Innovation 2000 Best of Show Award Presented at the 2000 Int'l CES Innovations 2000 Design & Engineering Showcase, 1 page.
Ahmad, "A Usable Real-Time 3D Hand Tracker," Proceedings of the 28th Asilomar Conference on Signals, Systems and Computers—Part 2 (of 2) vol. 2 (Oct. 1994), 5 pages.
Sylvania, "Intellvision™ Intelligent Television Master Component Service Manual," pp. 1, 2 and 8, 1979.
Kobayashi (1996) "Design of Dynamic Soundscape: Mapping Time to Space for Audio Browsing with Simultaneous Listening," Thesis submitted to Program in Media Arts and Sciences at the Massachusetts Institute of Technology, (58 pages).
Kobayashi et al. (1997) "Dynamic Soundscape: Mapping Time to Space for Audio Browsing," *Computer Human Interaction:* 16 pages.
Kobayashi et al. "Development of the Touch Switches with the Click Response," Koukuu Denshi Gihou No. 17: pp. 44-48 (1994-3) (published by the Japan Aviation Electronics Industry, Ltd.); Translation of Summary.
International Search Report and Written Opinion, dated Dec. 6, 2007, directed to related International Application No. PCT/US2007/015501.
Robbin, U.S. Appl. No. 60/346,237 entitled, "Method and System for List Scrolling,", filed Oct. 22, 2001; 12 pages.
Zadesky et al., U.S. Appl. No. 60/359,551 entitled "Touchpad for Handheld Device,", filed Feb. 25, 2002; 34 pages.
Grignon et al., U.S. Appl. No. 60/755,656, filed Dec. 30, 2005, entitled "Touch Pad with Feedback"; 109 pages.
Elias et al., U.S. Appl. No. 60/522,107, filed Aug. 16, 2004, entitled, "A Method for Increasing the Spatial Resolution of Touch Sensitive Devices"; 15 pages.
Hotelling, U.S. Appl. No. 60/658,777 titled "Multi-Functional Handheld Device,", filed Mar. 4, 2005; 68 pages.
Zadesky et al., U.S. Appl. No. 60/714,609 entitled "Scrolling Input Arrangements Using Capacitive Sensors on a Flexible Membrane,", filed Sep. 6, 2005; 17 pages.
Lampell et al., U.S. Appl. No. 60/810,423, filed Jun. 2, 2006, entitled "Techniques for Interactive Input to Portable Electronic Devices"; 53 pages.
Prest et al., U.S. Appl. No. 60/850,662, filed Oct. 11, 2006, entitled, "Capacitive Scroll Wheel"; 21 pages.
Bollinger, U.S. Appl. No. 60/858,404, filed Nov. 13, 2006, entitled "Method of Capacitively Sensing Finger Position"; 13 pages.
Rothkopf, U.S. Appl. No. 60/935,854 titled "Compact Media Players,", filed Sep. 4, 2007; 36 pages.
Rathnam et al., U.S. Appl. No. 60/992,056, filed Dec. 3, 2007, entitled, "Scroll Wheel Circuit Arrangements And Methods Of Use Thereof"; 42 pages.
Rathnam et al., U.S. Appl. No. 61/017,436, filed Dec. 28, 2007, entitled, "Multi-Touch Scroll Wheel Circuit Arrangements And Processing Methods"; 58 pages.
Weber et al., U.S. Appl. No. 61/020,531, filed Jan. 11, 2008 entitled "Modifiable Clickwheel Text"; 11 pages.
Weber et al., U.S. Appl. No. 61/025,531, filed Feb. 1, 2008 entitled "Co-Extruded Materials and Methods"; 11 pages.
Fisher et al., U.S. Appl. No. 61/036,804, filed Mar. 14, 2008 entitled "Switchable Sensor Configurations"; 46 pages.
Robbin et al., U.S. Appl. No. 60/387,692 entitled "Method and Apparatus for Use of Rotational User Inputs,", filed Jun. 10, 2002.
Robbin et al., U.S. Appl. No. 60/399,806 entitled "Graphical User Interface and Methods of Use Thereof in a Multimedia Player,", filed Jul. 30, 2002.
Tsuk et al., U.S. Office Action mailed Oct. 13, 2006, directed to U.S. Appl. No. 10/256,716; 16 pages.
Tsuk et al., U.S. Office Action mailed Aug. 3, 2006, directed to U.S. Appl. No. 10/256,716; 15 pages.
Tsuk et al., U.S. Office Action mailed Jan. 10, 2006, directed to U.S. Appl. No. 10/256,716; 12 pages.
Tsuk et al., U.S. Office Action mailed Jun. 24, 2005, directed to U.S. Appl. No. 10/256,716; 12 pages.
Tsuk et al., U.S. Office Action mailed Sep. 30, 2004, directed to U.S. Appl. No. 10/256,716; 11 pages.
Tsuk et al., U.S. Office Action mailed Jul. 7, 2009, directed to U.S. Appl. No. 11/610,190; 24 pages.
Robbin et al., U.S. Office Action mailed Jan. 18, 2007, directed to U.S. Appl. No. 10/259,159; 18 pages.
Robbin et al., U.S. Office Action mailed Oct. 13, 2006, directed to U.S. Appl. No. 10/259,159; 18 pages.
Robbin et al., U.S. Office Action mailed Aug. 3, 2006, directed to U.S. Appl. No. 10/259,159; 15 pages.
Robbin et al., U.S. Office Action mailed Jan. 11, 2006, directed to U.S. Appl. No. 10/259,159; 15 pages.
Robbin et al., U.S. Office Action mailed Jun. 16, 2005, directed to U.S. Appl. No. 10/259,159; 16 pages.
Robbin et al., U.S. Office Action mailed Sep. 30, 2004, directed to U.S. Appl. No. 10/259,159; 14 pages.
Zadesky et al., U.S. Office Action mailed Jul. 9, 2008, directed to U.S. Appl. No. 10/643,256; 12 pages.

Zadesky et al., U.S. Office Action mailed Dec. 12, 2007, directed to U.S. Appl. No. 10/643,256; 12 pages.
Zadesky et al., U.S. Office Action mailed Jul. 13, 2007, directed to U.S. Appl. No. 10/643,256; 13 pages.
Zadesky et al., U.S. Office Action mailed Mar. 23, 2007, directed to U.S. Appl. No. 10/643,256; 11 pages.
Zadesky et al., U.S. Office Action mailed Oct. 27, 2006, directed to U.S. Appl. No. 10/643,256; 14 pages.
Hotelling et al., U.S. Office Action mailed Jan. 27, 2009, directed to U.S. Appl. No. 11/882,421; 15 pages.
Zadesky et al., U.S. Office Action mailed Aug. 6, 2009, directed to U.S. Appl. No. 11/057,050; 30 pages.
Zadesky et al., U.S. Office Action mailed Feb. 20, 2009, directed to U.S. Appl. No. 11/057,050; 25 pages.
Zadesky, et al., U.S. Office Action mailed Dec. 24, 2008, directed to U.S. Appl. No. 11/057,050; 25 pages.
Zadesky et al., U.S. Office Action mailed Nov. 26, 2008, directed to U.S. Appl. No. 11/057,050; 25 pages.
Zadesky et al, U.S. Office Action mailed Aug. 19, 2008, directed to U.S. Appl. No. 11/057,050; 23 pages.
Zadesky et al., U.S. Office Action mailed Nov. 20, 2007, directed to U.S. Appl. No. 11/057,050; 33 pages.
Zadesky et al., U.S. Office Action mailed Mar. 5, 2009, directed to U.S. Appl. No. 11/477,469; 12 pages.
Zadesky et al., U.S. Office Action mailed Jul. 30, 2004, directed to U.S. Appl. No. 10/188,182; 7 pages.
Zadesky et al., U.S. Office Action mailed Sep. 21, 2005, directed to U.S. Appl. No. 10/188,182; 10 pages.
Zadesky et al., U.S. Office Action mailed Mar. 4, 2004, directed to U.S. Appl. No. 10/188,182; 8 pages.
Zadesky et al., U.S. Office Action mailed Oct. 4, 2007, directed to U.S. Appl. No. 11/386,238; 12 pages.
Zadesky et al.., U.S. Office Action mailed Oct. 4, 2007, directed to U.S. Appl. No. 11/806,957; 14 pages.
Marriott et al., U.S. Office Action mailed Jan. 30, 2008, directed to U.S. Appl. No. 10/722,948; 17 pages.
Marriott et al., U.S. Office Action mailed Jul. 13, 2007, directed to U.S. Appl. No. 10/722,948; 15 pages.
Marriott et al., U.S. Office Action mailed Dec. 12, 2006, directed to U.S. Appl. No. 10/722,948; 14 pages.
Marriott et al., U.S. Office Action mailed Jun. 2, 2006, directed to U.S. Appl. No. 10/722,948; 12 pages.
Hotelling et al., U.S. Office Action mailed Jul. 24, 2009, directed to U.S. Appl. No. 11/483,008; 17 pages.
Hotelling et al., U.S. Office Action mailed Jul. 27, 2009, directed to U.S. Appl. No. 11/882,420; 17 pages.
Elias et al., U.S. Office Action mailed Aug. 4, 2009, directed to U.S. Appl. No. 11/203,692; 12 pages.
Elias et al., U.S. Office Action mailed Feb. 23, 2009, directed to U.S. Appl. No. 11/203,692; 13 pages.
Elias et al., U.S. Office Action mailed Sep. 17, 2008, directed to U.S. Appl. No. 11/203,692; 8 pages.
Translation of Trekstor's Defense Statement to the District Court Mannheim of May 23, 2008; 37 pages.
"Diamond Multimedia Announces Rio PMP300 Portable MP3 Music Player," located at http://news.harmony-central.com/Newp/1998/Rio-PMP300.html visited on May 5, 2008. (4 pages).

* cited by examiner

SCROLLING INPUT ARRANGEMENTS USING CAPACITIVE SENSORS ON A FLEXIBLE MEMBRANE

PRIORITY CLAIM TO PROVISIONAL APPLICATION

A claim for priority is hereby made under the provisions of 35 U.S.C. § 119 for the present application based upon U.S. Provisional Application No. 60/714,609, filed on Sep. 6, 2005.

BACKGROUND

As modern electronic devices have continued to evolve, size reduction has become a preeminent design consideration. Indeed, shrinking device profiles have made pocket electronics possible while preserving robust processing capability. Much progress has been made in shrinking electronic components like integrated circuits. However, mechanical support systems have sometimes lagged behind electronic advances. At least one reason for this lag is that many mechanical structures are limited by strength to weight considerations. Thus, while a miniaturized circuit may consume ever shrinking profiles, a mechanical structure may be limited to a minimum size in order to achieve structural stability. In some examples, structural stability may include unwanted inefficiencies.

For example, FIG. 1 is an illustrative cross-sectional representation of a scrolling device portion 100. Embodiments of this device are described in detail in U.S. patent application Ser. No. 10/188,182 entitled, "TOUCH PAD HANDHELD DEVICE," and in U.S. patent application Ser. No. 10/643,256 entitled, "MOVABLE TOUCH PAD WITH ADDED FUNCTIONALITY," which are hereby incorporated by reference. Scrolling device portion 100 includes a cover 104 that provides a protection for the device. An adhesive layer 108 mechanically couples cover 104 with printed circuit board (PCB) 112. PCB 112 may provide structural support for electronic components like, for example, a capacitive sensor (not shown), an integrated circuit 128, a switch 120 and a connection pad 116. PCB's 112 structural rigidity provides at least some durability to the device, but its use is not without some inherent disadvantages.

For example, PCB's may be limited to a minimum thickness. Minimum thickness is due to structural requirements that may, in some examples, be unavoidable. Further, because a PCB is rigid, applications may, in some examples, require that features like integrated circuit 128, switch 120, and connection pad 116 be co-located with the PCB. Co-location requirements may add to the device stack height further limiting size reductions. Still further, co-location of associated electronic components, like a switch, for example, may ultimately lead to device failure due to cracked soldering or components as a result of stresses imparted on the PCB during switch cycling. Still further, PCB rigidity may result in some loss of tactile responsiveness of an electronic component like a switch, for example. Therefore scrolling input arrangements using capacitive sensors on a flexible membrane are presented herein.

As may also be appreciated, capacitive sensors such as those described above generally may respond undesirably in rapidly changing temperature conditions. For example, in a rapidly heating environment, both the environment as well as an input pointer such as a finger may cause an increase in capacitance signals on sensors. In current designs, if recalibration is conducted while a finger is present, the unit may "calibrate out" the finger. Thus, either the unit remains with an incorrect calibration or it does not respond to the finger. Thus, methods of calibrating a plurality of capacitive sensors in response to rapidly changing positive temperature gradients are presented herein.

SUMMARY

The following presents a simplified summary of some embodiments of the invention in order to provide a basic understanding of the invention. This summary is not an extensive overview of the invention. It is not intended to identify key/critical elements of the invention or to delineate the scope of the invention. Its sole purpose is to present some embodiments of the invention in a simplified form as a prelude to the more detailed description that is presented below.

Scrolling input arrangements are presented including: a flexible membrane; a number of capacitive sensors mechanically integrated with the flexible membrane, the capacitive sensors radially disposed with respect to a first axis that is perpendicular with respect to the flexible membrane; an integrated circuit mechanically coupled with the flexible membrane and electronically coupled with the capacitive sensors, the integrated circuit configured to process a number of electronic signals from the capacitive sensors to provide a scrolling function; and a connection region on the flexible membrane for electronically coupling the scrolling input arrangement with an electronic device. In some embodiments, the capacitive sensors are configured with a plate element having a first surface area and a trace element having a second surface area such that the first surface area and second surface area comprise a sensor surface area, wherein the sensor surface areas for the capacitive sensors is substantially equal in size. In some embodiments, the integrated circuit includes logic for calibrating the plurality of capacitive sensors in response to a changing positive temperature gradient. In some embodiments, the changing positive temperature gradient is approximately 4° C./ms within a range of approximately 0° C. to 60° C. In some embodiments, the arrangement further includes: a number of switches mechanically integrated with the flexible membrane, the switches configured for providing a number of selection functions wherein at least one of the switches is approximately co-located with the first axis.

In other embodiments, low-profile scrolling input assemblies are presented including: a scrolling input arrangement for providing a scrolling function, the scrolling input arrangement having a top surface and a bottom surface, the scrolling input arrangement including, a flexible membrane; a number of capacitive sensors mechanically integrated with the flexible membrane, the capacitive sensors radially disposed with respect to a first axis that is perpendicular with respect to the flexible membrane; an integrated circuit mechanically coupled with the flexible membrane, the integrated circuit electronically coupled with the capacitive sensors, the integrated circuit configured to process a plurality of electronic signals from the capacitive sensors to provide a scrolling function; a connection region on the flexible membrane for electronically coupling the integrated circuit with a device; a backing plate for providing mechanical support for the scrolling input arrangement, the backing plate mechanically coupled with the bottom surface; and a cover plate for providing protecting the top surface, the cover plate configured to provide a low-friction surface to receive a user input. In some embodiments, assemblies further include: a number of switches mechanically integrated with the flexible membrane, the switches configured for providing a number of selection functions. In some embodiments, the backing plate further includes a number of actuator nubs for actuating the switches. In some embodiments, assemblies further include a number of anti-rotation elements for securing the assembly against a rotational force.

In other embodiments, methods of calibrating a number of capacitive sensors in response to a changing positive temperature gradient are presented including: establishing a baseline, the baseline comprising a first minimum function of a signal from each of the plurality of capacitive sensors; scanning the plurality capacitive sensors; and if more than eight of the plurality of capacitive sensors exceeds a threshold value, determining a thermal drift of the plurality of capacitive sensors, the thermal drift corresponding to a second minimum function of a signal from each of the capacitive sensors, and for each of the capacitive sensors, calculating an updated baseline based on the baseline and the thermal drift such that the capacitive sensors are calibrated. In some embodiments, the threshold value is selected to avoid a noise floor of the capacitive sensors. In some embodiments, scanning the capacitive sensors frequency is conducted at a frequency of approximately three megahertz.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

Figure 1:
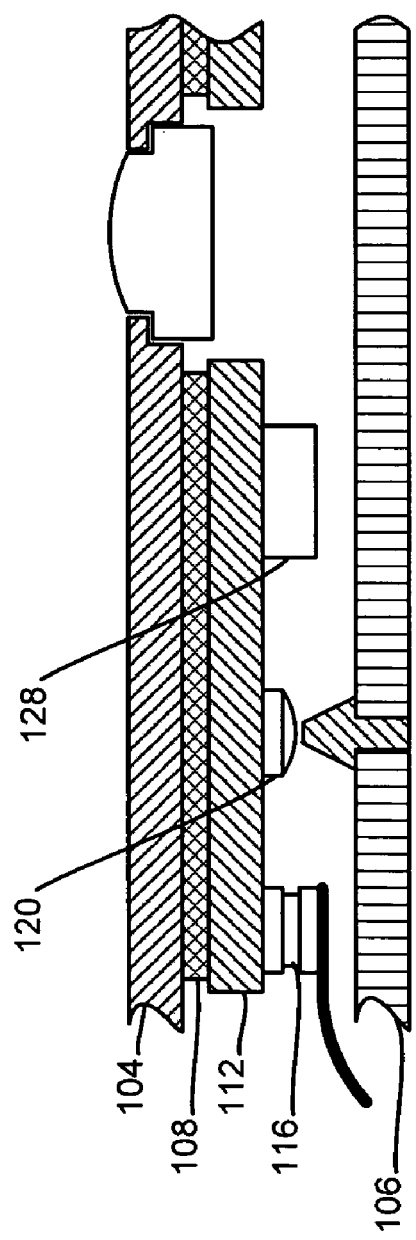
FIG. 1 is an illustrative cross-sectional representation of a scrolling device portion.
Figure 2:
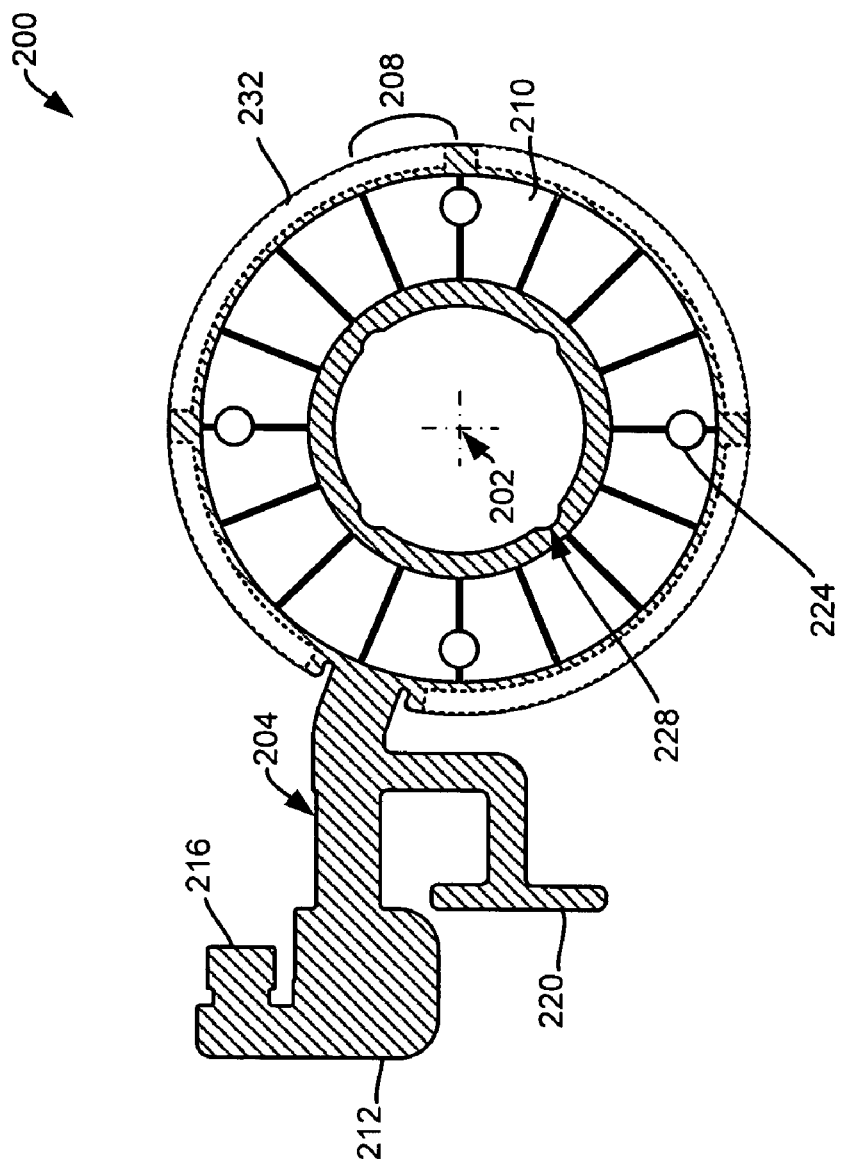
FIG. 2 is an illustrative representation of a scrolling input arrangement in accordance with an embodiment of the present invention.

FIG. 2 is an illustrative representation of a scrolling input arrangement 200 in accordance with an embodiment of the present invention. In particular, scrolling input arrangement 200 includes a flexible membrane 204. In some embodiments, flexible membrane 204 is a polyimide film. Flexible membrane 204 provides distinct advantages over prior solutions. For example, flexible membrane 204 provides a reduction in thickness over printed circuit boards (PCB) while still providing adequate structure for electronic components. In some embodiments, flexible membrane 204 may have a thickness of approximately 0.21 millimeters where typical PCB applications have a thickness of approximately 0.50 millimeters. Flexible membrane 204 provides further advantage by allowing associated electronic components and connectors to be disposed away from an arrangement stack comprised of capacitive elements. Allowing associated electronic components and connectors to be disposed away from an arrangement stack may thus provide a thinner cross-sectional profile of scrolling input arrangement 200 as well as provide mechanical shock insulation for associated electronic components. In this manner, a smaller, more durable arrangement may be realized.

In some instances, flexible membrane 204 may provide for increased tactile feedback efficiency. Tactile feedback efficiency is a measurement of a user's ability to discern a tactile change. Thus, when tactile feedback efficiency is high, a user is more readily able to discern a tactile change. In one example, a switch or plurality of switches may be co-located with flexible membrane 204. When those switches are actuated, a user may more readily discern a tactile change (e.g. a "click") over prior art solutions because of flexible membrane's 204 physical properties. As a further advantage, tactile specificity may result because of flexible membrane's 204 physical properties. That is, because of flexible membrane's 204 elasticity, unintentional actuation of switches may be reduced or avoided altogether. This may allow for more switches to be placed closer together while avoiding inadvertent actuation of neighboring switches.

As can be appreciated, flexible membrane 204 may be cut or formed into any number of shapes in accordance with user preferences. The illustrated shape is provided for clarity and should not be construed as limiting. Mechanically integrated with flexible membrane 204 are a variety of electronic components. Mechanical integration of capacitive sensors, for example, may be accomplished by gluing, bonding, molding, or any other method known in the art without departing from the present invention. A number of capacitive sensors 208 may be radially disposed with respect to axis 202, which is perpendicular with respect to flexible membrane 204. Capacitive sensors 208 may also be mechanically integrated with top surface of flexible membrane 204. In some embodiments, 16 capacitive sensors are utilized. Capacitive sensors 208 may be mechanically integrated with flexible membrane 204 in any manner well-known in the art. Each capacitive sensor includes a plate element 210 and a trace element (not shown). A plate element is one plate in a capacitor and is mechanically integrated with flexible membrane 204. Trace elements (not shown) may also be mechanically integrated with flexible membrane 204. Trace elements provide for electronic communication between capacitive sensors 208 and integrated circuit (IC) region 212. An IC provides processing capability for capacitive sensors 208. IC processing will be discussed in further detail below for FIG. 6. Any number of IC's may be mechanically coupled with flexible membrane 204 without departing from the present invention. Mechanical coupling of integrated circuits, for example, may be accomplished by gluing, bonding, molding, or any other method known in the art without departing from the present invention.

As can be appreciated, for each capacitive sensor, the sum of the surface area of its corresponding plate element and the surface area of its corresponding trace element is the sensor surface area. In some embodiments, the sensor surface area for all capacitive sensors is substantially equal in size. Thus, where a longer trace element is required due to location constraints, a corresponding smaller surface area of the plate element results. Thus, plate elements may not match exactly in some embodiments. At least one reason for matching sensor surface areas is so that sensing will be uniform across the arrangement. As can be appreciated, where matching sensor surface areas is not practicable, adjustments for each sensor may be made algorithmically thus calibrating each sensor to its particular configuration.

Scrolling input arrangement 200 may further include ground pad 220 for electronically connecting with a ground source. Ground shielding 232 may be incorporated in some embodiments to provide for electronic isolation of capacitive sensors 208. Ground shielding may be mechanically integrated with flexible membrane 204 in any manner well-known in the art. A connection region 216 may be utilized for electronically coupling the arrangement 200 with an associated electronic device. In some examples, the electronic device is an IPOD™. Any number of connectors may be mechanically integrated with flexible membrane 204 without departing from the present invention.

Still further, in some embodiments, flexible membrane 204 may be configured with anti-rotation elements 228. Anti-rotation elements provide rotational stability for flexible membrane 204. In this example, anti-rotation elements are embodied as cut-outs that mate with a matching surface. In other embodiments, through holes 224 may be provided to allow actuator nubs disposed on one side of scrolling input arrangement 200 to reach electronic elements disposed on an opposite side of scrolling input arrangement 200. As can be appreciated, anti-rotation elements and through holes may be configured in any manner in accordance with user preferences without departing from the present invention.

Figure 3:
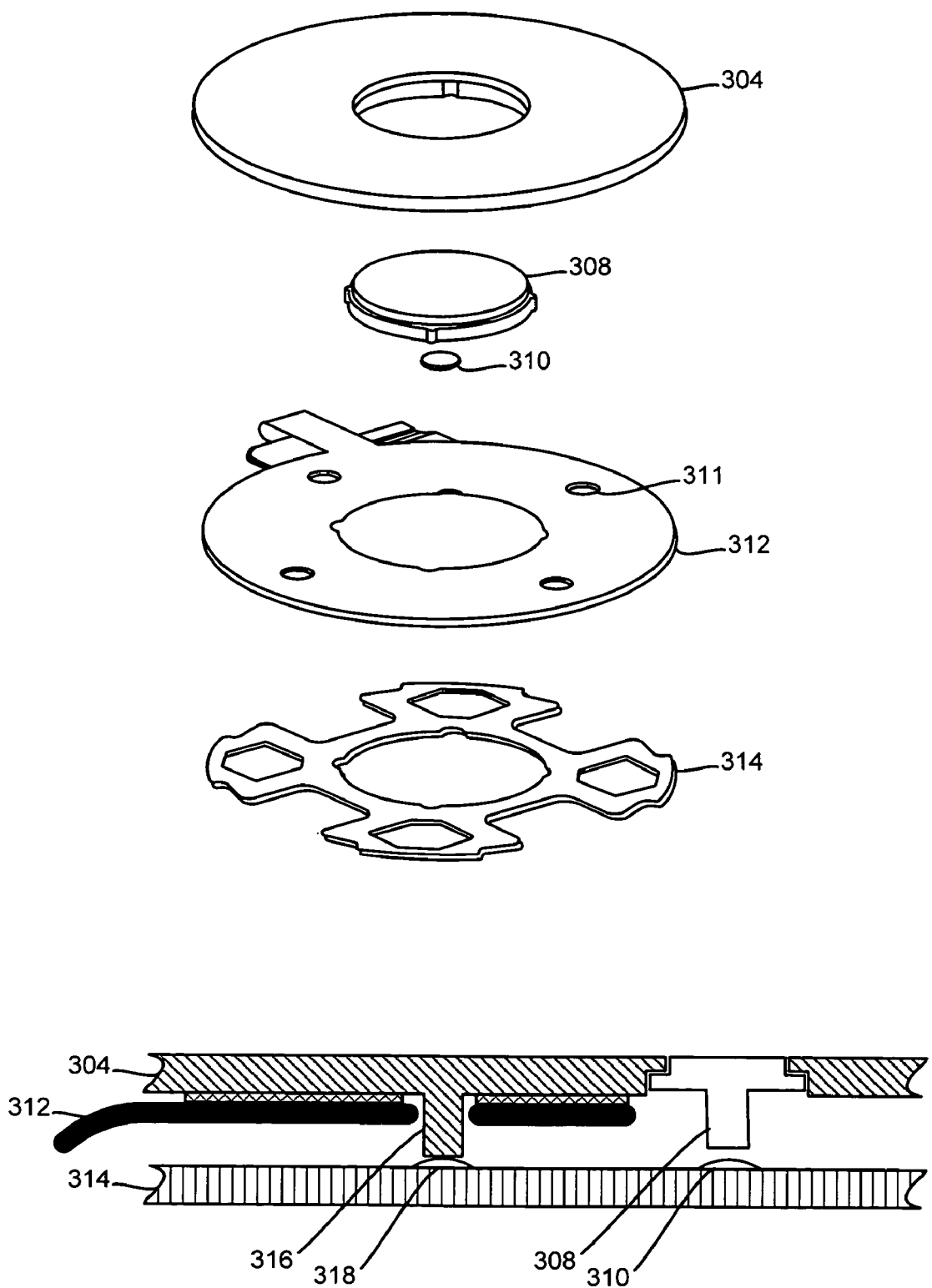
FIG. 3 is an illustrative representation in exploded as well as cross-section views of a scrolling input assembly in accordance with an embodiment of the present invention.

FIG. 3 is an illustrative representation in exploded as well as cross-section views of a scrolling input assembly 300 in accordance with an embodiment of the present invention. Scrolling input assembly 300 includes a scrolling input arrangement 312 such as those described above for FIG. 2. Scrolling input assembly 300 further includes cover plate 304. Cover plate 304 may provide protection for the top surface of scrolling input arrangement 312. Cover plate 304 may also provide a low-friction surface to receive user input from, for example, a finger or stylus. Referring to cross-sectional illustration, cover plate 304 may be configured with an actuator nub 316 for actuating a switch 318. Switch 318 may be electronically coupled with a processor or IC to provide selection functions individually or in combination. As can be appreciated, through holes 311 (see also FIG. 2) provide access for actuator nub 318. Cover plate 304 may be composed of any suitable material that does not interfere with capacitive sensing. In some embodiments thermoplastic is utilized to create a cover plate. It should be noted that the figures provided herein are for illustrative purposes only and should not be construed to provide precise dimensions.

In some embodiments, scrolling input assembly 300 may include a center button 308 that may actuate switch 310. Switch 310 may be electronically coupled with a processor or IC to provide selection functions. Backing plate 314 may be mechanically coupled with the bottom surface of scrolling input arrangement 312 to provide structural support. Backing plate 314 may also provide a grounding surface in some embodiments.

Figure 4:
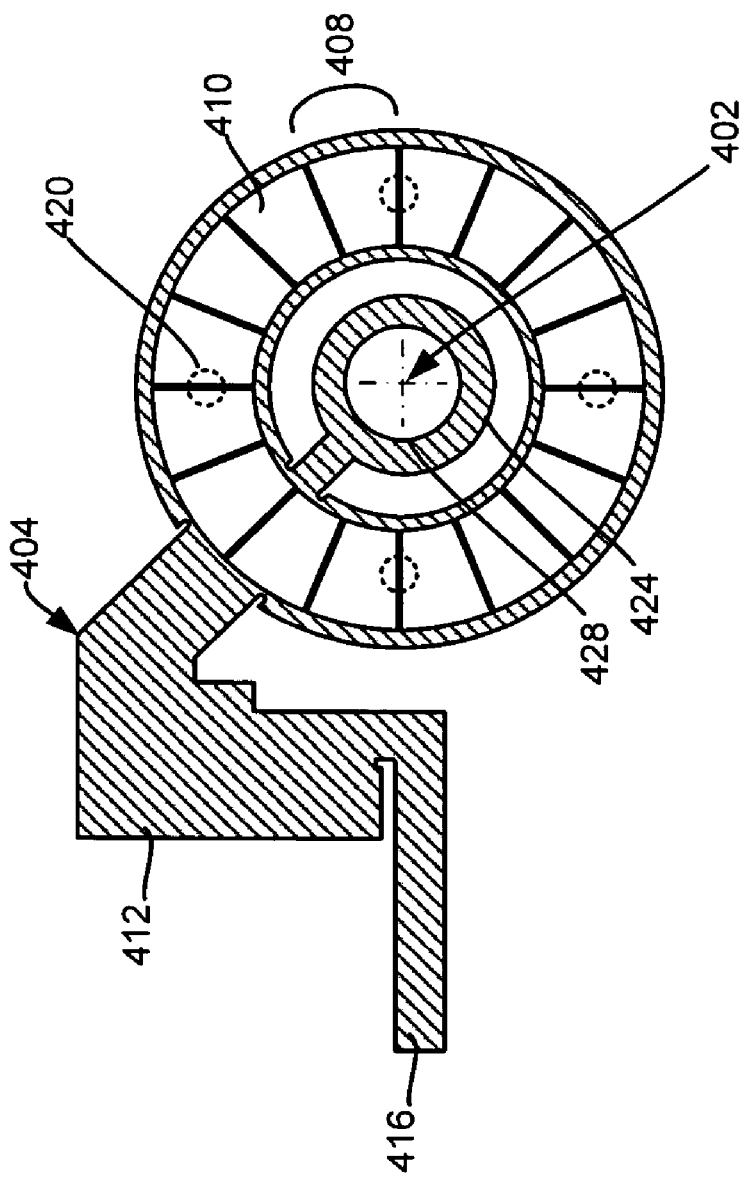
FIG. 4 is an illustrative representation of a scrolling input arrangement in accordance with an embodiment of the present invention.

FIG. 4 is an illustrative representation of a scrolling input arrangement 400 in accordance with an embodiment of the present invention. In particular, scrolling input arrangement 400 includes a flexible membrane 404. In some embodiments, flexible membrane 404 is a polyimide film. Flexible membrane 404 provides distinct advantages over prior solutions. For example, flexible membrane 404 provides a reduction in thickness over printed circuit boards (PCB) while still providing adequate structure for electronic components. In some embodiments, flexible membrane 404 may have a thickness of approximately 0.21 millimeters where typical PCB applications have a thickness of approximately 0.50 millimeters. Flexible membrane 404 provides further advantage by allowing associated electronic components and connectors to be disposed away from an arrangement stack comprised of capacitive elements. Allowing associated electronic components and connectors to be disposed away from an arrangement stack may thus provide a thinner cross-sectional profile of scrolling input arrangement 400 as well as provide mechanical shock insulation for associated electronic components. In this manner, a smaller, more durable arrangement may be realized.

In some instances, flexible membrane 404 may provide for increased tactile feedback efficiency. Tactile feedback efficiency is a measurement of a user's ability to discern a tactile change. Thus, when tactile feedback efficiency is high, a user is more readily able to discern a tactile change. In one embodiment, switch 420 may be mechanically integrated with flexible membrane 404. When switch 420 actuated, a user may more readily discern a tactile change (e.g. a "click") over prior art solutions because of flexible membrane's 404 physical properties. As a further advantage, tactile specificity may result because of flexible membrane's 404 physical properties. That is, because of flexible membrane's 404 elasticity, unintentional actuation of switches may be reduced or avoided altogether. This may allow for more switches to be placed closer together while avoiding inadvertent actuation of neighboring switches. In other embodiments, a flexible membrane 404 may include a center region 424 for mechanically integrating center switch 428 such that the center switch is approximately co-located with axis 402. As noted above for FIG. 2, electronic components (e.g. switches) need not be co-located with capacitive sensors. In some embodiments, however, some advantages may be realized by co-locating some electronic components with capacitive sensors such as ease of manufacture or assembly.

As can be appreciated, flexible membrane 404 may be cut or formed into any number of shapes in accordance with user preferences. The illustrated shape is provided for clarity and should not be construed as limiting. Mechanically integrated with flexible membrane 404 are a variety of electronic components. A number of capacitive sensors 408 may be radially disposed with respect to axis 402 and mechanically integrated with top surface of flexible membrane 404. In some embodiments, 16 capacitive sensors are utilized. Capacitive sensors 408 may be mechanically integrated with flexible membrane 404 in any manner well-known in the art. Each capacitive sensor includes a plate element 410 and a trace element (not shown). A plate element is one plate in a capacitor and is mechanically integrated with flexible membrane 404. Trace elements (not shown) may also be mechanically integrated with flexible membrane 404. Trace elements provide for electronic communication between capacitive sensors 408 and integrated circuit (IC) region 412. An IC provides processing capability for capacitive sensors 408. IC processing will be discussed in further detail below for FIG. 6. Any number of IC's may be mechanically integrated with flexible membrane 404 without departing from the present invention.

As can be appreciated, for each capacitive sensor, the sum of the surface area of its corresponding plate element and the surface area of its corresponding trace element is the sensor surface area. In some embodiments, the sensor surface area for all capacitive sensors is equivalent. Thus, where a longer trace element is required due to location constraints, a corresponding smaller surface area of the plate element results. Thus, plate elements may not match exactly in some embodiments. At least one reason for matching sensor surface areas is so that sensing will be uniform across the arrangement. As can be appreciated, where matching sensor surface areas is not practicable, adjustments for each sensor may be made algorithmically thus calibrating each sensor to its particular configuration.

Finally, a connection region 416 may be utilized for electronically coupling the arrangement 400 with an associated electronic device. In some examples, the electronic device is an IPOD™. Any number of connectors may be mechanically integrated with flexible membrane 404 without departing from the present invention.

Figure 5:
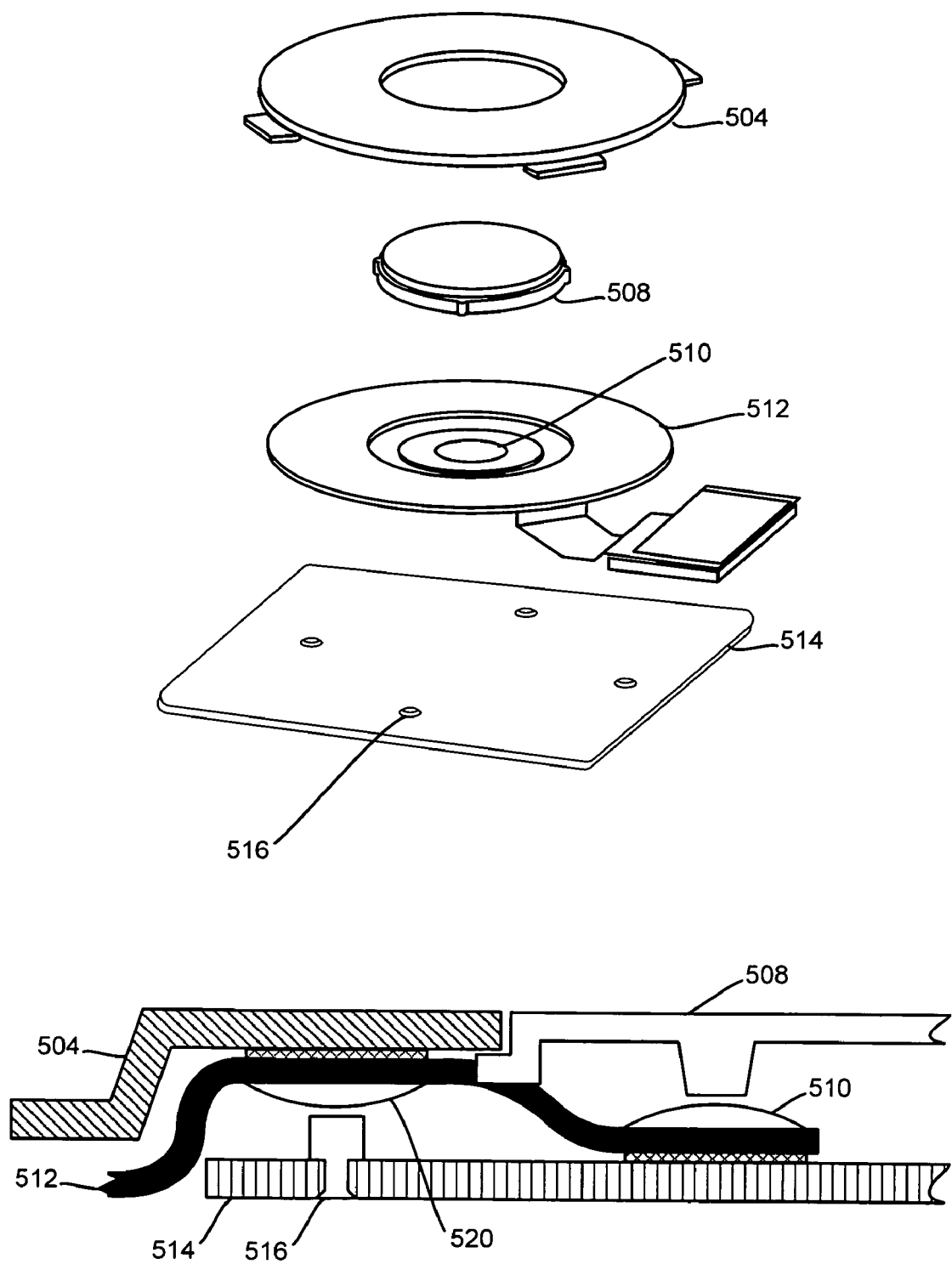
FIG. 5 is an illustrative representation in exploded as well as cross-section views of a scrolling input assembly in accordance with an embodiment of the present invention.

FIG. 5 is an illustrative representation in exploded as well as cross-section views of a scrolling input assembly 500 in accordance with an embodiment of the present invention. Scrolling input assembly 500 includes a scrolling input arrangement 512 such as those described above for FIG. 4. Scrolling input assembly 500 further includes cover plate 504. Cover plate 504 may provide protection for the top surface of scrolling input arrangement 512. Cover plate 504 may also provide a low-friction surface to receive user input from, for example, a finger or stylus. Cover plate 504 may be composed of any suitable material that does not interfere with capacitive sensing. In some embodiments thermoplastic is utilized to create a cover plate. It should be noted that the figures provided herein are for illustrative purposes only and should not be construed to provide precise dimensions.

In some embodiments, scrolling input assembly 500 may include a center button 508 that may actuate switch 510 on scrolling arrangement 512. Switch 510 may be electronically coupled with a processor or IC to provide selection functions. Backing plate 514 may be mechanically coupled with the bottom surface of scrolling input arrangement 512 to provide structural support. Backing plate 514 may also provide a grounding surface in some embodiments. In still other embodiments, grounding plate 514 may be configured with actuator nub 516 for actuating switch 520 on scrolling input arrangement 512. In some embodiments, actuator nub 516 may be co-compression molded.

Figure 6:
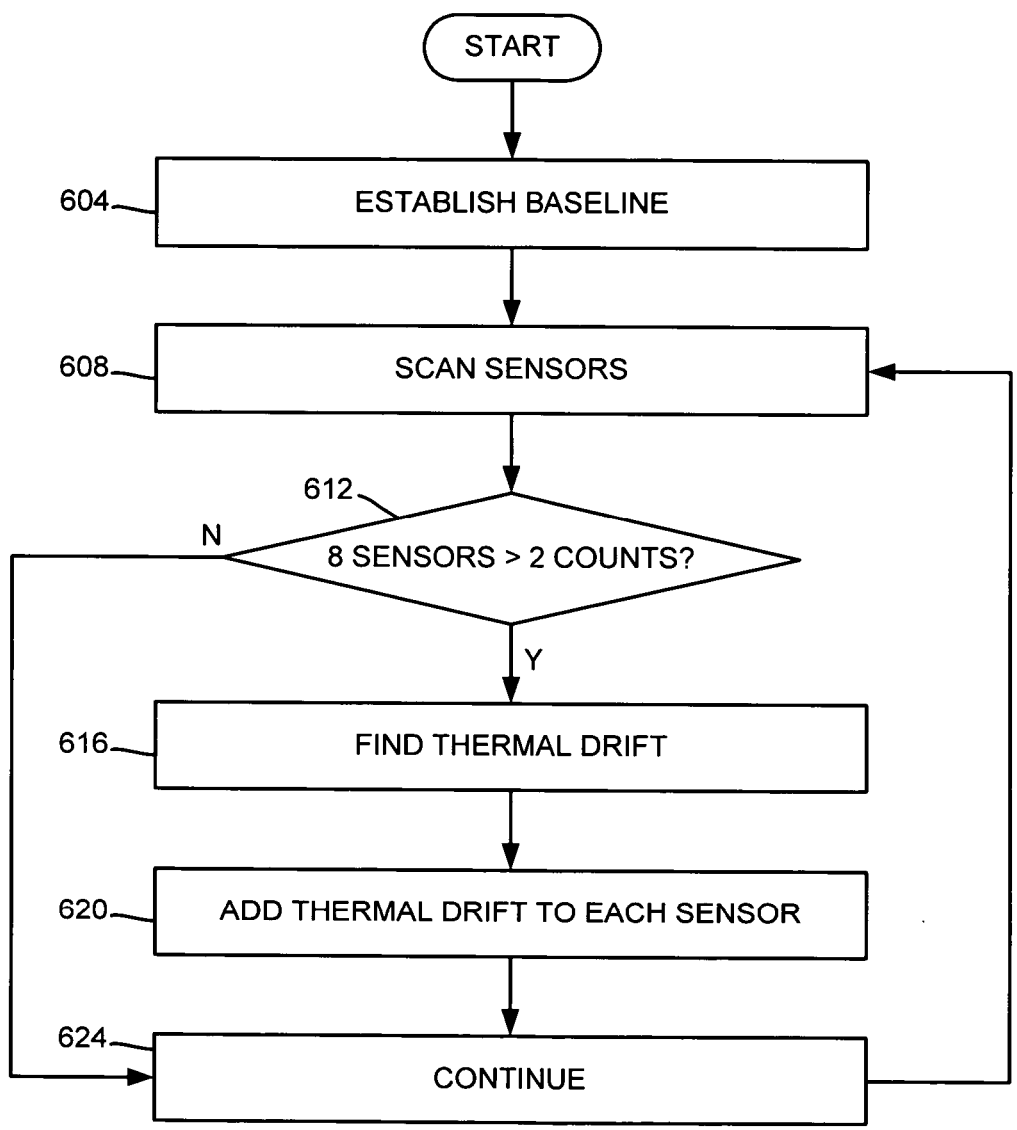
FIG. 6 is an illustrative flowchart of a method of calibrating a plurality of capacitive sensors in accordance with an embodiment of the present invention.

FIG. 6 is an illustrative flowchart of a method of calibrating a plurality of capacitive sensors in accordance with an embodiment of the present invention. As noted above, current designs may fail to properly calibrate in environments experiencing rapid temperatures changes. In one example, embodiments may be configured to respond to a temperature change of approximately 4° C./ms within a range of approximately 0° C. to 60° C. Thus, at a first step 604, a baseline is established. A baseline may be established by assuming a current baseline and then scanning a plurality of capacitive sensors and tracking a lower edge of that scan to find a current sample. A minimum function of the current sample and the current baseline will provide a new current baseline for use with methods described herein.

At a next step 608, capacitive sensors are scanned. As can be appreciated, responsiveness of a system is determined at least in part by the frequency with which samples are taken. For example, if a capacitive sensor is scanned more often, then the accuracy of the sample is likely to be much higher than if the capacitive sensor is scanned less often. Processing power and power consumption are two factors which account for a selection of sample frequency. In some embodiments described herein capacitive sensors are scanned at a frequency of approximately three megahertz. Once capacitive sensors are scanned at a step 608, the method determines whether more than eight capacitive sensors have a count change greater than two. The selection of number of capacitive sensors corresponds to a likely change in sensor not attributable to a finger. That is, it is assumed, in this example, that a finger generally covers no more than eight capacitive sensors at any one time. In this manner, the method is determining whether a change in sensor is attributable to a change in ambient. A change in counts corresponds to a change in temperature. The selection of how many counts (i.e. threshold value) corresponds to a count high enough to avoid the noise floor of the sensor while still providing a count responsive to rapid changes. As can be appreciated by one skilled in the art, a noise floor of a sensor is generally sensor dependent. That is, for any given sensor, a noise floor may be specified by the manufacturer in accordance with manufacturing parameters. Thus, when more than eight capacitive sensors are scanned that have a count change greater than two, the method then calculates thermal drift at a step 616.

Thermal drift corresponds to a change in baseline attributable to change in ambient temperature. In one embodiment, thermal drift is a minimum function of the signals of all capacitive sensors. Once thermal drift is found, that value is added to each capacitive sensor signal value at a step 620 thus creating a new baseline for each capacitive sensor signal value. The method continues to a step 624 continuing to a step 608 to scan all capacitive sensors. If the method, at a step 612 determines that eight or more capacitive sensors do not have a count change greater than two, the method continues to a step 624 continuing to a step 608 to scan all capacitive sensors.

While this invention has been described in terms of several embodiments, there are alterations, permutations, and equivalents, which fall within the scope of this invention. It should also be noted that there are many alternative ways of implementing the methods and apparatuses of the present invention. For example, although embodiments described herein provide for 16 capacitive sensors, more or fewer sensors may be utilized depending on user preferences and system requirements without departing from the present invention. Further, while scanning frequency has been described as approximately three megahertz, higher and lower frequencies may be employed without departing from the present invention. It is therefore intended that the following appended claims be interpreted as including all such alterations, permutations, and equivalents as fall within the true spirit and scope of the present invention.

What is claimed is:

1. A scrolling input arrangement comprising:
a flexible membrane; a plurality of capacitive sensors mechanically integrated with the flexible membrane, the plurality of capacitive sensors radially disposed with respect to a first axis that is perpendicular with respect to the flexible membrane;

an integrated circuit mechanically coupled onto an integrated circuit region of the flexible membrane and electronically coupled with the plurality of capacitive sensors, the integrated circuit configured to process a plurality of electronic signals from the plurality of capacitive sensors to provide a scrolling function; and a connection region on the flexible membrane for electronically coupling the scrolling input arrangement with an electronic device.

2. The arrangement of claim 1 wherein each of the plurality of capacitive sensors is configured with a plate element having a first surface area and a trace element having a second surface area such that the first surface area and second surface area comprise a sensor surface area, wherein the sensor surface areas for the plurality of capacitive sensors is substantially equal in size.

3. The arrangement of claim 1 wherein the integrated circuit includes logic for calibrating the plurality of capacitive sensors in response to a changing positive temperature gradient.

4. The arrangement of claim 3 wherein the changing positive temperature gradient is approximately 4.degree. C./ms within a range of approximately 0.degree. C. to 60.degree. C.

5. The arrangement of claim 2 further comprising:
a plurality of switches mechanically integrated with the flexible membrane, the plurality of switches configured for providing a plurality of selection functions wherein at least one of the plurality of switches is approximately co-located with the first axis.

6. The arrangement of claim 1 wherein the flexible membrane is a polyimide film.

7. The arrangement of claim 6 wherein the flexible membrane has a thickness of approximately 0.21 millimeters.

8. The arrangement of claim 6 wherein the flexible membrane is further configured with a plurality of anti-rotation elements for securing the flexible membrane against a rotational force.

9. The arrangement of claim 1 wherein the plurality of capacitive sensors includes at least 16 sensors.

10. A low-profile scrolling input assembly comprising:
a scrolling input arrangement for providing a scrolling function, the scrolling input arrangement having a top surface and a bottom surface, the scrolling input arrangement comprising, a flexible membrane;
a plurality of capacitive sensors mechanically integrated with the flexible membrane, the plurality of capacitive sensors radially disposed with respect to a first axis that is perpendicular with respect to the flexible membrane;
an integrated circuit mechanically coupled onto an integrated circuit region of the flexible membrane, the integrated circuit electronically coupled with the plurality of capacitive sensors, the integrated circuit configured to process a plurality of electronic signals from the plurality of capacitive sensors to provide a scrolling function;
a connection region on the flexible membrane for electronically coupling the integrated circuit with a device;
a backing plate for providing mechanical support for the scrolling input arrangement, the backing plate mechanically coupled with the bottom surface; and
a cover plate for providing protecting the top surface, the cover plate configured to provide a low-friction surface to receive a user input.

11. The assembly of claim 10 further comprising:
a plurality of switches mechanically integrated with the flexible membrane, the plurality of switches configured for providing a plurality of selection functions.

12. The assembly of claim 11 wherein at least one of the plurality of switches is approximately co-located with the first axis.

13. The assembly of claim 11 wherein the backing plate further comprises a plurality of actuator nubs for actuating the plurality of switches.

14. The assembly of claim 10 wherein the cover plate further comprises a plurality of actuator nubs for actuating a plurality of switches mechanically integrated with the flexible membrane.

15. The assembly of claim 10 wherein the integrated circuit includes logic for calibrating the plurality of capacitive sensors in response to a changing positive temperature gradient.

16. The assembly of claim 15 wherein the changing positive temperature gradient is approximately 4.degree. C./ms within a range of approximately 0.degree. C. to 60.degree. C.

17. The assembly of claim 10 further comprising a plurality of anti-rotation elements for securing the assembly against a rotational force.

18. A method of calibrating a plurality of capacitive sensors in response to a changing positive temperature gradient, comprising:
establishing a baseline, the baseline comprising a first minimum function of a signal from each of the plurality of capacitive sensors;
scanning the plurality capacitive sensors; and
if more than eight of the plurality of capacitive sensors exceeds a threshold value, determining a thermal drift of the plurality of capacitive sensors, the thermal drift corresponding to a second minimum function of a signal from each of the plurality of capacitive sensors, and for each of the plurality of capacitive sensors, calculating an updated baseline based on the baseline and the thermal drift such that the plurality of capacitive sensors is calibrated.

19. The method of claim 18 wherein the threshold value is selected to avoid a noise floor of the plurality of capacitive sensors.

20. The method of claim 18 wherein the scanning the plurality of capacitive sensors frequency is conducted at a frequency of approximately three megahertz.

21. The flexible membrane of claim 1, wherein the membrane comprises a polyimide film.

22. The flexible membrane of claim 1, wherein the membrane has a thickness less than approximately 0.50 millimeters.

* * * * *